(12) United States Patent
Lake et al.

(10) Patent No.: US 8,450,821 B2
(45) Date of Patent: May 28, 2013

(54) METHOD AND APPARATUS PROVIDING COMBINED SPACER AND OPTICAL LENS ELEMENT

(75) Inventors: Rick Lake, Meridian, ID (US); Jacques Duparre, Jena (DE)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 12/412,026

(22) Filed: Mar. 26, 2009

(65) Prior Publication Data

US 2010/0244165 A1 Sep. 30, 2010

(51) Int. Cl.
*H01L 31/0232* (2006.01)
*H01L 21/00* (2006.01)

(52) U.S. Cl.
USPC ............... 257/432; 438/64; 438/69; 257/436

(58) Field of Classification Search
USPC ................. 438/48–98; 257/428–466
See application file for complete search history.

(56) References Cited

U.S. PATENT DOCUMENTS

| | | | |
|---|---|---|---|
| 4,695,719 A * | 9/1987 | Wilwerding | 250/216 |
| 4,739,160 A | 4/1988 | Kawabe et al. | |
| 4,808,812 A * | 2/1989 | Tanaka et al. | 250/216 |
| 5,359,190 A * | 10/1994 | O'Regan et al. | 250/216 |
| 5,815,306 A * | 9/1998 | Sheridon et al. | 359/296 |
| 5,902,997 A * | 5/1999 | Kropp | 250/216 |
| 6,072,634 A | 6/2000 | Broome et al. | |
| 6,416,237 B2 * | 7/2002 | Lissotschenko et al. | 385/88 |
| 7,298,941 B2 * | 11/2007 | Palen et al. | 385/33 |
| 2004/0077121 A1 * | 4/2004 | Maeda et al. | 438/75 |
| 2005/0041134 A1 * | 2/2005 | Takayama | 348/340 |
| 2005/0061950 A1 * | 3/2005 | Jiang et al. | 250/208.1 |
| 2006/0044450 A1 * | 3/2006 | Wolterink et al. | 348/340 |
| 2006/0238894 A1 * | 10/2006 | Sano | 359/714 |
| 2008/0073734 A1 * | 3/2008 | Kong | 257/432 |
| 2008/0175605 A1 * | 7/2008 | Sakurai | 399/4 |
| 2008/0290435 A1 | 11/2008 | Oliver et al. | |
| 2009/0027777 A1 * | 1/2009 | Kyoya | 359/581 |

FOREIGN PATENT DOCUMENTS

| | | |
|---|---|---|
| JP | 60127122 | 7/1985 |
| JP | 2002090621 | 3/2002 |
| WO | WO 02056076 | 7/2002 |

* cited by examiner

*Primary Examiner* — Fernando L Toledo
*Assistant Examiner* — Karen Kusumakar
(74) *Attorney, Agent, or Firm* — Dickstein Shapiro LLP

(57) ABSTRACT

A method and apparatus used for forming a lens and spacer combination, and imager module employing the spacer and lens combination. The apparatus includes a mold having a base, spacer section, and mold feature. The method includes using the mold with a blank to create a spacer that includes an integral lens. The spacer and lens combination and imager modules can be formed on a wafer level.

31 Claims, 16 Drawing Sheets

METHOD AND APPARATUS PROVIDING COMBINED SPACER AND OPTICAL LENS ELEMENT

FIELD OF THE INVENTION

The embodiments described herein relate to spacers and optical lenses which may be used in imaging devices, and methods of their manufacture.

BACKGROUND OF THE INVENTION

Microelectronic imagers are used in a multitude of electronic devices. As microelectronic imagers have decreased in size and improvements have been made with respect to image quality and resolution, they have become commonplace devices and are used, for example, in computers, mobile telephones, and personal digital assistants (PDAs), in addition to their traditional uses in digital cameras.

Microelectronic imagers include image sensors that typically use charged coupled device (CCD) systems and complementary metal-oxide semiconductor (CMOS) systems, as well as other solid state imager systems.

Microelectronic imager modules, such as module 150 shown in FIG. 1, are often fabricated at a wafer level in which many such modules are formed as part of a wafer assembly and then separated. The imager module 150 includes an imager die 108, which includes an imager pixel array 106 and associated circuits (not shown). Imager pixel array 106 may be a CCD or CMOS imager pixel array, or any other type of solid state imager pixel array. Imager module 150 may also include a lens structure 112, having a spacer 109 and at least one lens element 111 arranged on a portion of a lens wafer 510. Spacer 109 maintains lens element 111 at a proper distance from imager pixel array 106, such that light striking lens element 111 is directed appropriately to imager pixel array 106. Spacer 109 may be bonded to imager die 108 by a bonding material 104 such as epoxy. Typically, lens element 111 comprises one or more optically transmissive lenses made of glass or plastic material configured to focus light radiation onto imager pixel array 106. In addition, the lens structure 112 may be combined with another optically transmissive element, such as a package lid.

In practice, imager modules 150 are fabricated at a wafer level in mass rather than individually. As shown in a top-down view in FIG. 2A and a cross-sectional view in FIG. 2B—both FIGS. showing a portion of a larger wafer assembly—multiple imager dies 108a-108d (four shown here for simplified illustration) are fabricated on a semiconductor wafer 90. Each die includes a respective imager pixel array (FIG. 2B illustrates two arrays 106a, 106b because it is a cross-sectional view). As shown in FIGS. 3A and 3B, multiple lens elements 111a-111d (again, four shown here for simplified illustration), corresponding in number and location to the imager pixel arrays 106 on imager wafer 90 (FIGS. 2A and 2B), may be fabricated on a lens wafer 510. A replication process, for example an ultraviolet embossing, can be used to duplicate the surface topology of a lens master onto a thin film of an ultraviolet-curable epoxy resin applied to lens wafer 510. As shown in FIG. 4A, lens wafer 510 is placed so that it is separated from imager wafer 90 by spacers 109, the latter typically formed on a separate spacer wafer. Additionally, lens wafer 510 is located such that lens elements 111a-111d (FIG. 4A illustrates only 111a and 111b because it is a cross-sectional view) are optically aligned with imager dies 108a-108d (FIG. 4A illustrates only 108a and 108b because it is a cross-sectional view) to form a plurality of imager modules 150a, 150b (other imager modules are formed, but not shown in FIG. 4A). As shown in FIG. 4C, the imager modules 150a, 150b may then be separated into individual imager modules 150a, 150b by dicing.

One technique for creating the spacers 109 is to place a mask over a glass or polymer wafer material used for spacer 109 prior to using fine-grit sand to blast through these non-masked portions of the glass or polymer wafer. This creates a through-hole spacer 109. Another technique for creating a through-hole spacer 109 is to place an etch stop material over a glass or polymer wafer and apply an etching material that removes the glass or polymer in those portions where the etch stop material is not present. Both of these techniques have shortfalls. Primarily, both techniques can result in a through-hole that has at least some taper resulting from a greater application of either fine-grit sand or etching material to the portion of the hole closest to where the removal media is being applied. This taper can appear where non-tapered through-holes are required, or can more greatly exaggerate a desired taper. Accordingly, a method of fabrication of spacers 109 is required where the dimensions of the spacer can be more precisely maintained.

In addition to fabrication problems, the fabrication of spacers 109 on a separate wafer introduces additional steps into the imager assembly process. Currently when assembling an imager, the spacer 109 wafer must be aligned over the imager wafer 90, and the lens wafer 510 must then be aligned over the spacer 109 wafer. This creates multiple opportunities for misalignment.

Referring now to FIG. 4B, in cases where multiple lenses (stacked over one another) are required, an additional spacer 109a wafer must be placed over lens wafer 510, and an additional lens wafer 510a with lens elements 111e-111f must be placed over the additional level of spacers 109a. With each additional lens element that must be added to the imager module fabrication becomes even more complex, and the likelihood of misalignment further increases.

Accordingly, there is a need for an apparatus and method that provides through holes that have reduced inadvertent tapering during formation of the spacers, reduces the assembly steps necessary for both single- and multi-lens imagers, and reduces the likelihood of misalignment for both single- and multi-lens imagers.

DETAILED DESCRIPTION OF THE INVENTION

Figure 1:
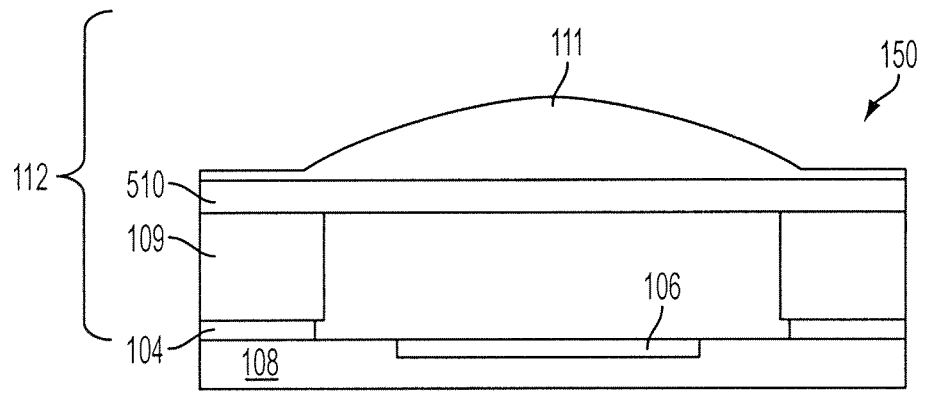
FIG. 1 illustrates an imager module.
Figure 2A:
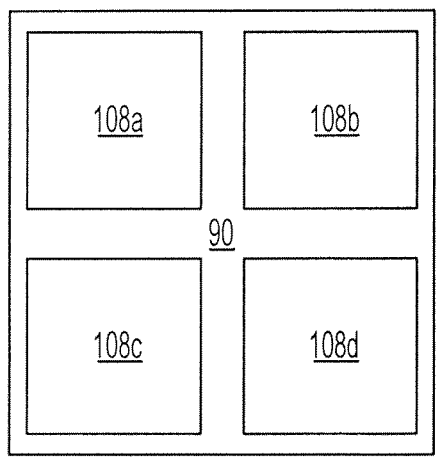
FIGS. 2A-2B illustrate a portion of an imager wafer assembly.
Figure 2B:
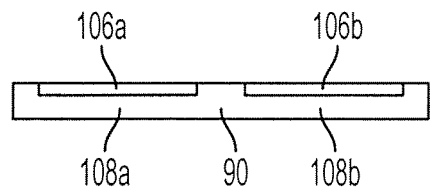
Figure 3A:
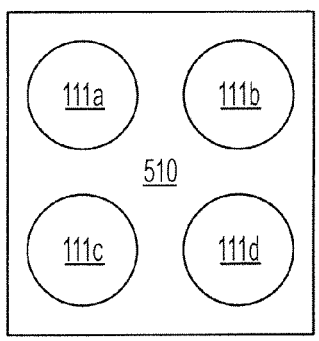
FIGS. 3A-3B illustrate a portion of a lens wafer assembly.
Figure 3B:
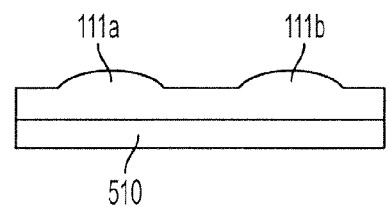
Figure 4A:
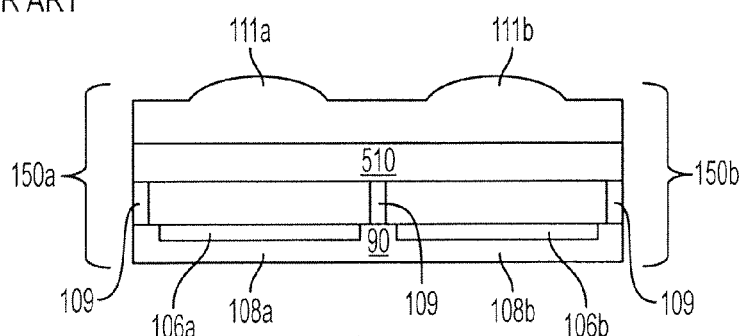
FIG. 4A illustrates a portion of an imager module assembly with a single lens element over each imager array.
Figure 4B:
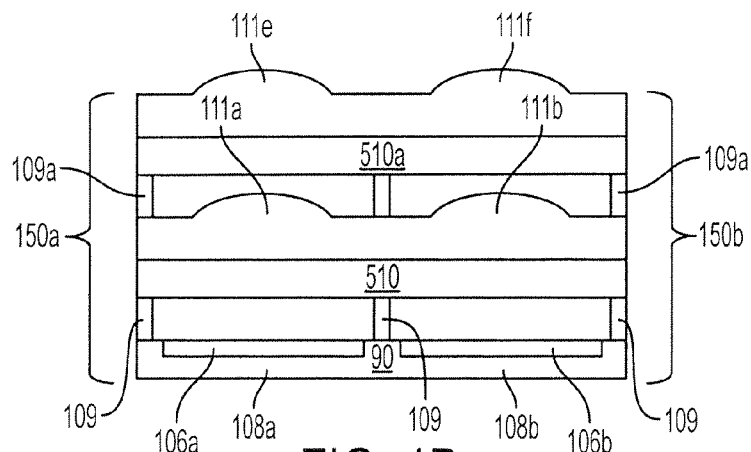
FIG. 4B illustrates a portion of an imager module assembly with two lens elements over each imager array.
Figure 4C:
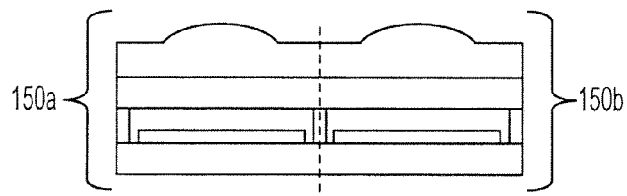
FIG. 4C illustrates a portion of an imager module assembly with a single lens element over each imager array, and shows where imager modules are separated by dicing.

In the following description, reference is made to the accompanying drawings which form a part hereof, and in which are shown by way of illustrations specific embodiments that may be practiced. It should be understood that like reference numerals represent like elements throughout the drawings. These example embodiments are described in sufficient detail to enable those skilled in the art to practice them. It is to be understood that other embodiments may be utilized, and that structural, material and electrical changes may be made, only some of which are discussed in detail below.

Figure 12A:
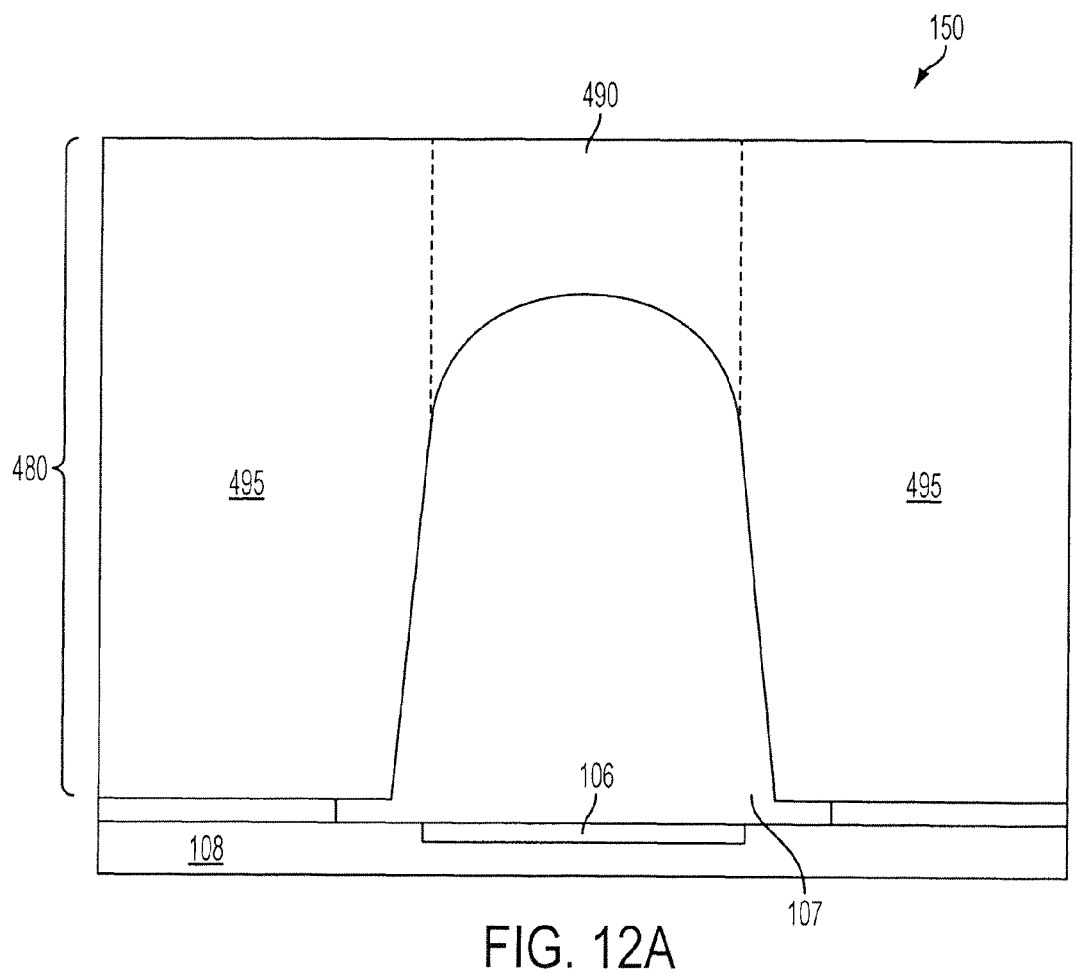
FIG. 12A illustrates a cross-sectional view of an assembled imager module having a single concave combination spacer lens wafer according to a first example embodiment described herein.
Figure 12B:
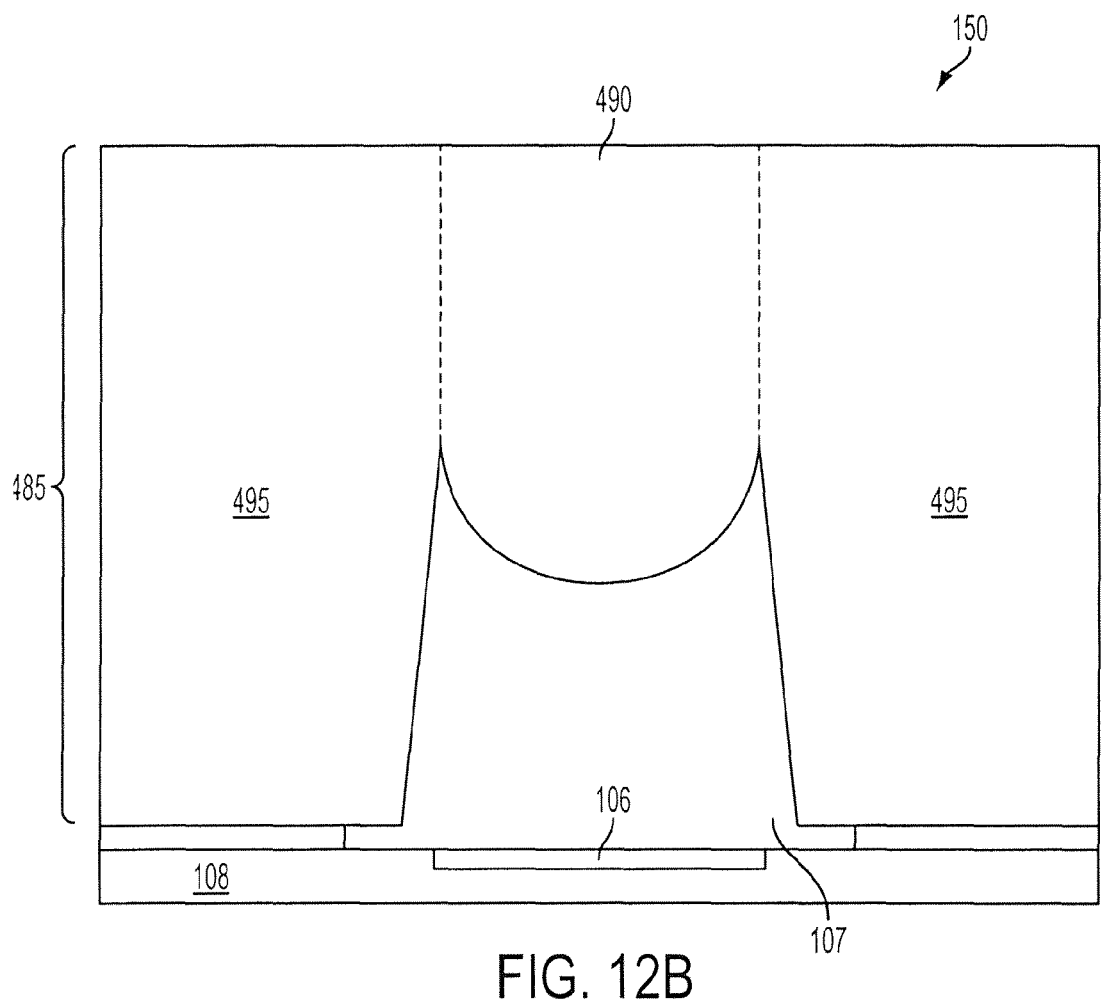
FIG. 12B illustrates a cross-sectional view of an assembled imager module having a single convex combination spacer lens wafer according to a second example embodiment described herein.

Referring now to FIGS. 12A and 12B, which illustrate two example embodiments, embodiments described herein relate to an apparatus and method for making combination spacer lens wafers 480 (FIG. 12A) and 485 (FIG. 12B). Embodiments described herein also relate to the concave combination spacer lens wafer 480 (first embodiment) and the convex combination spacer lens wafer 485 (second embodiment), themselves.

Two embodiments of an apparatus used with a method for making combination spacer lens wafers 480 (FIG. 12A) and 485 (FIG. 12B) are described. Convex form mold 200 (FIG. 5A) (first embodiment) is used to make concave combination spacer lens wafers 480 (first embodiment). Concave form mold 205 (FIG. 5B) (second embodiment) is used to make convex combination spacer lens wafer 485 (second embodiment).

Two embodiments of a method for making the combination spacer lens wafers 480 (FIG. 12A) and 485 (FIG. 12B) are also described. These two embodiments are identical, except that the method (shown in FIGS. 7A, 8A, and 9A) (first embodiment) for making a concave combination spacer lens wafer 480 (first embodiment) uses convex form mold 200 (FIG. 5A) (first embodiment) while the method (shown in FIGS. 7B, 8B, and 9B) (second embodiment) for making convex combination spacer lens wafer 485 (second embodiment) uses concave form mold 205 (FIG. 5B) (second embodiment).

The convex form mold 200 (FIG. 5A), the method of making a concave combination spacer lens wafer 480, and the finished concave combination spacer lens wafer 480 are described first.

Figure 5A:
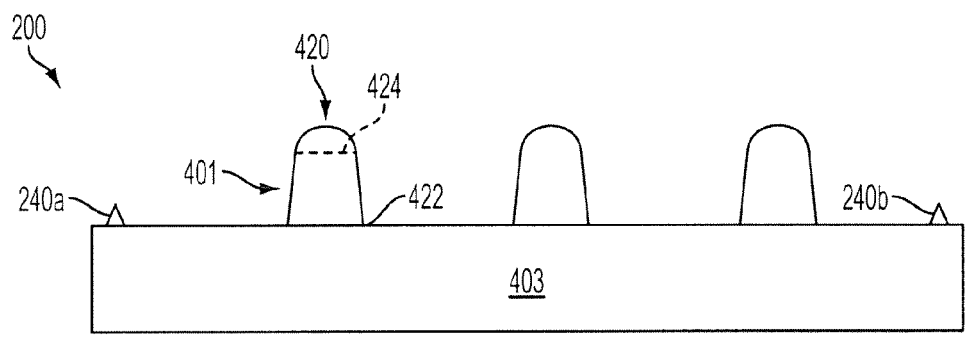
FIG. 5A illustrates a cross-sectional view of a convex form mold for producing a combination spacer lens wafer having a concave lens according to a first example embodiment described herein.

Referring to FIG. 5A, the convex form mold 200—the apparatus for making concave combination spacer lens wafer 480 (FIG. 12A)—is now described. Convex form mold 200 has spacer section 401, base 403 and convex mold feature 420 at the distal end of the spacer section 401. The convex mold feature 420, however, is not intended to be limiting. A protrusion (mold feature 420) of any shape can be made to create a corresponding combination lens portion 490 (FIG. 12A). As such, highly aspherical lens structures are also possible.

Figure 6A:
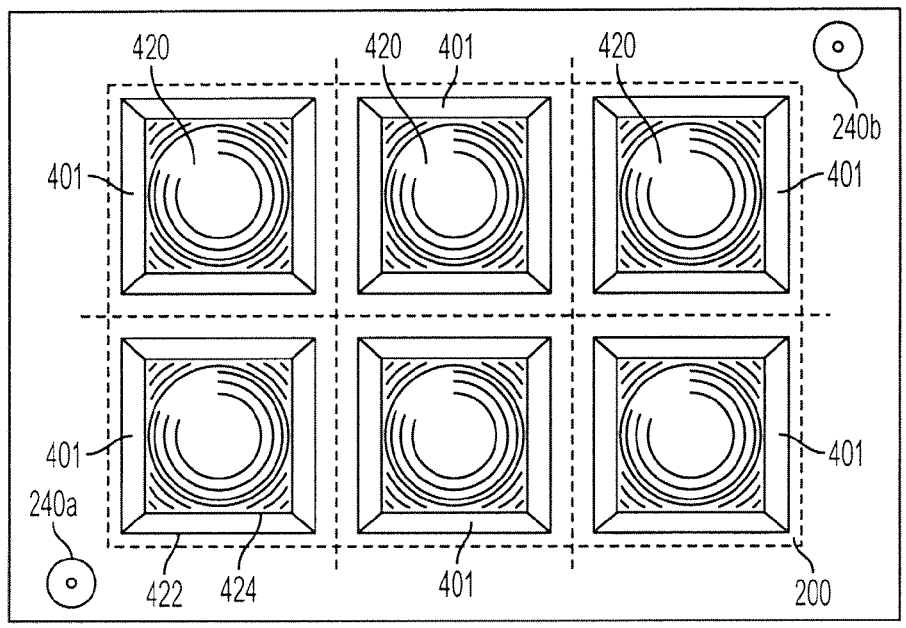
FIG. 6A illustrates an overhead view of a convex form mold for producing a combination spacer lens wafer having a concave lens according to a first example embodiment described herein.

Just as the example embodiment for convex mold feature 420 is not intended to be limiting, the example embodiment for spacer section 401 is also not intended to be limiting. Referring now to FIG. 6A (overhead view of FIG. 5A), spacer section 401 is shown having a large square base 422, while mold feature 420 which is at the distal end of spacer section 401 is shown having a small square base 424. In this embodiment, spacer section 401 tapers between large square base 422 and the small square base 424. Spacer section 401, however, can have any shape base 422. Similarly, mold feature 420 can have any shape base 424. As such, spacer section 401 can have any shape, to include a non-tapered shape, or a non-uniform shape. The spacer section 401 and mold feature 420 are preferably integrally formed.

Figure 8A:
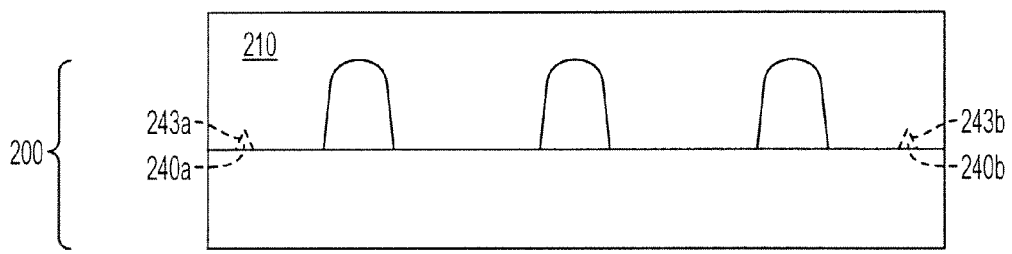

Referring now to FIGS. 5A and 6A, the convex form mold 200 may also have optional alignment elements 240a, 240b that can be used to create corresponding alignment detents 243a, 243b (FIG. 8A). These alignment detents 243a, 243b (FIG. 8A) may be used to align concave combination spacer lens wafer 480 (FIG. 12A) with imager die 108 (FIG. 12A), or alternatively with another concave combination spacer lens wafer 480 (FIG. 12A), a conventional spacer 109 (FIG. 1), or any imager module part having appropriate alignment detents 243a, 243b (FIG. 8A) complementary to alignment elements 240a, 240b. Two symmetric alignment elements 240a, 240b are shown, but a single non-symmetric alignment element may also be used in conjunction with a matching alignment detent in embodiments where fewer alignment elements are desired.

The method for forming an unfinished concave combination spacer lens wafer 478 (FIG. 10A) is now described with reference to FIGS. 7A, 8A, 9A, and 10A. To form an unfinished concave combination spacer lens wafer 478, a convex form mold 200 (FIG. 5A) is used.

Figure 7A:
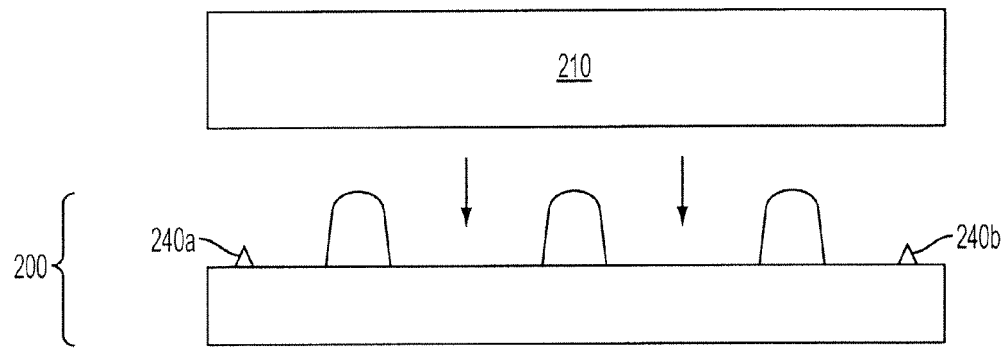
FIGS. 7A, 8A, and 9A illustrate steps of a method of making a combination spacer lens wafer having a concave lens according to a first example embodiment described herein.

Referring to FIG. 7A, convex form mold 200 is placed underneath wafer blank 210. In one embodiment, wafer blank 210 comprises a float glass. Although glass is described, an optical polymer may also be used. One example of a float glass that may be used is a boro-float glass with a coefficient of thermal expansion between 2 and 5, such as Borofloat® 33 from Schott North America, Inc. Whether using glass or an optical polymer, the wafer blank 210 may also be in liquid form.

In cases where wafer blank 210 is not in liquid form, wafer blank 210 is made sufficiently malleable to assume the form of convex form mold 200—whether glass or polymer—by heating wafer blank 210 using any suitable method. Once an appropriate temperature is reached if heating is being applied, wafer blank 210 is lowered into contact with and pressed on to convex form mold 200. Wafer blank 210 may be heated to an appropriate temperature while on convex form mold 200 to allow convex form mold 200 to penetrate wafer blank 210. Wafer blank 210 may receive convex mold feature 420 (FIG. 5A) and spacer section 401 (FIG. 5A) of convex form mold 200. Wafer blank 210 may also receive alignment elements 240a, 240b if present.

Referring now to FIG. 8A, once wafer blank 210 has been displaced such that spacer section 401 (FIG. 5A), convex mold feature 420 (FIG. 5A), and alignment elements 240a, 240b (FIG. 7A) (if present) have been transferred, wafer blank 210 is allowed to cool so that it will hold its shape upon removal from convex form mold 200. Depending on the glass or polymer used for wafer blank 210, an appropriate curing time should be allowed to pass. Also based on the material used for wafer blank 210, the curing can be either an accelerated cooling, a gradual cooling, or alternating heating and cooling to ensure certain properties are developed within the glass or polymer used for wafer blank 210.

Figure 9A:
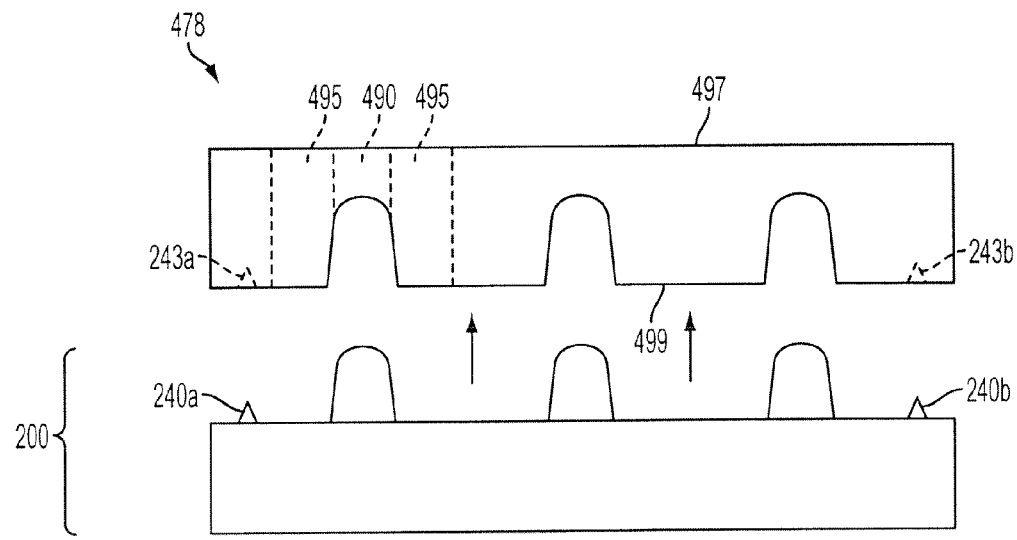
Figure 10A:
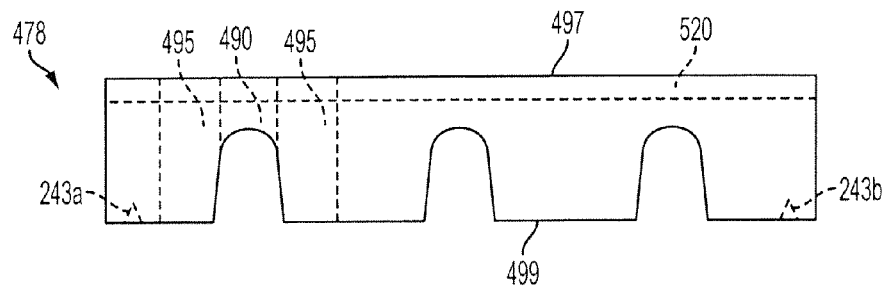
FIG. 10A illustrates an unfinished combination spacer lens wafer having a concave lens according to a first example embodiment described herein.

Referring now to FIG. 9A, once the appropriate curing or cooling has occurred, wafer blank 210 (FIG. 7A) has assumed the shape of convex form mold 200. Once this has occurred, unfinished concave combination spacer lens wafer 478 can be removed from convex form mold 200. Referring now to FIG. 10A, unfinished concave combination spacer lens wafer 478 has a combination lens portion 490 and a combination spacer portion 495. The unfinished concave combination spacer lens wafer 478 may also have alignment detents 243a, 243b in cases where the form mold 200 (FIG. 9A) had corresponding alignment elements 240a, 240b (FIG. 9A).

To ensure stability during placement and removal during the fabrication stages, wafer blank 210 (FIG. 7A) in most embodiments will have a thickness greater than that desired for use with the imager module 150 (FIG. 12A). This additional thickness may require the topmost portion 497 of unfinished concave combination spacer lens wafer 478 to undergo additional finishing through the removal of area 520. Additional finishing, however, may not be required for embodiments in which wafer blank 210 (FIG. 7A) does not require additional material for added stability during placement and removal of wafer blank 210 (FIG. 7A) during the fabrication stages.

Even in situations where additional material is unnecessary for stability purposes, grinding and polishing may still be necessary to achieve a flat surface. In these cases, displacement of wafer blank 210 (FIG. 7A) results in deformations at topmost portion 497 of unfinished concave combination spacer lens wafer 478. Grinding and polishing is performed to remove these deformations.

Figure 11A:
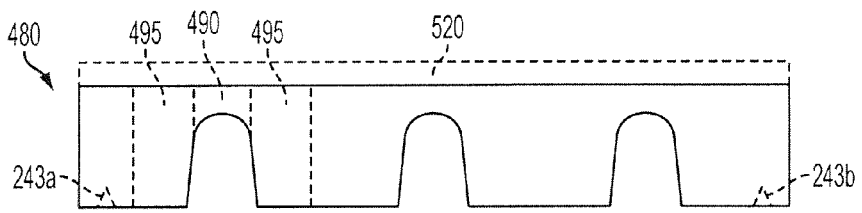
FIG. 11A illustrates a finished combination spacer lens wafer having a concave lens according to a first example embodiment described herein.

Referring now to FIG. 11A, in embodiments where additional finishing is required, unfinished concave combination spacer lens wafer 478 (FIG. 10A) will undergo a finishing step, which may include grinding, or chemical etching to narrow the distance between the top-most portion 497 (FIG. 10A) of unfinished concave combination spacer lens wafer 478 (FIG. 10A) and the bottom-most portion 499 (FIG. 10A) of unfinished concave combination spacer lens wafer 478 (FIG. 10A). The top-most portion 497 (FIG. 10A) undergoes the finishing step by removal of area 520. Once this thinning has occurred, the result is a finished concave combination spacer lens wafer 480.

The finished concave combination spacer lens wafer 480 is now described with reference to FIG. 12A. Finished concave combination spacer lens wafer 480 has a combination lens portion 490 and a combination spacer portion 495. The combination lens portion 490 acts as the lens, while the combination spacer portion 495 acts as a spacer for separating the combination lens portion 490 a specific distance from the imager pixel array 106. Finished concave combination spacer lens wafers 480 may also have alignment detents 243a, 243b (FIG. 11A) in cases where the form mold 200 (FIG. 5A) had corresponding alignment elements 240a, 240b (FIG. 5A).

Placing the finished concave combination spacer lens wafer 480 onto a wafer containing an imager pixel array 106 fully encloses combination spacer lens cavity 107. Whatever shape spacer section 401 (FIG. 5A) has during formation is the shape that spacer lens cavity 107 will have after assembly.

In one embodiment finished concave combination spacer lens wafers 480 can be divided into single finished concave combination spacer lens wafers 480. This enables a single finished concave combination spacer lens 480 to be individually placed on an imager pixel array 106. Alternatively, multiple finished concave combination spacer lenses 480 can remain joined and be simultaneously placed over and aligned with a wafer containing an imager pixel array 106. In this case, alignment can be done using alignment elements 240a, 240b (if present) in conjunction with alignment detents 243a, 243b (FIG. 11A). Additionally, moving finished concave combination spacer lens wafers 480 can be performed using a vacuum tool, as there are no through-holes in this combination spacer lens wafer 480 that were present in the prior art.

Figure 13A:
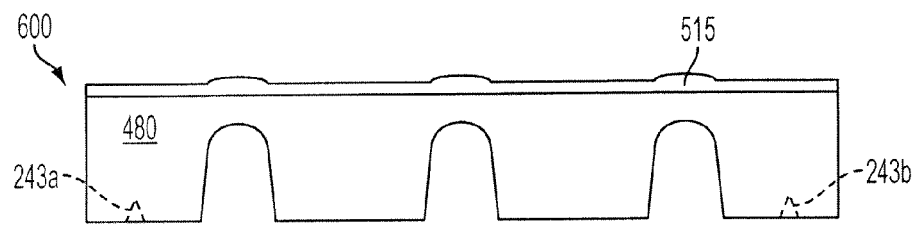
FIG. 13A illustrates a cross-sectional view of a combination spacer lens wafer having a concave lens according to a first example embodiment described herein with lens replication completed.

In cases where additional lenses (in a vertical stack) are required, the finished concave combination spacer lens wafer 480 can undergo additional processing steps. Referring now to FIG. 13A, a polymer lens replication step can be performed on the surface of finished concave combination spacer lens wafer 480 in order to form a finished concave combination spacer lens wafer with top-surface mounted polymer lens 600.

In embodiments having additional lenses, achromatization may be achieved by using distinct materials having different optical dispersions (variation of refractive index with wavelength, represented by an Abbe number). Using two separate materials, one with high dispersion (low Abbe number, less than or equal to 50), and one with low dispersion (high Abbe number, greater than 50), may avoid chromatic aberrations. Generally, a glass with high dispersion is used for the finished concave combination spacer lens wafer 480 and an ultraviolet-curable polymer (for example Ormocomp of the ORMOCER® material family from Micro Resist Technology) with a low dispersion may be used for the top-surface mounted polymer lens 515. In some cases, however, two different types of polymer having different optical dispersions may be used for both the finished concave combination spacer lens wafer 480 and the top-surface mounted polymer lens 515.

Figure 14A:
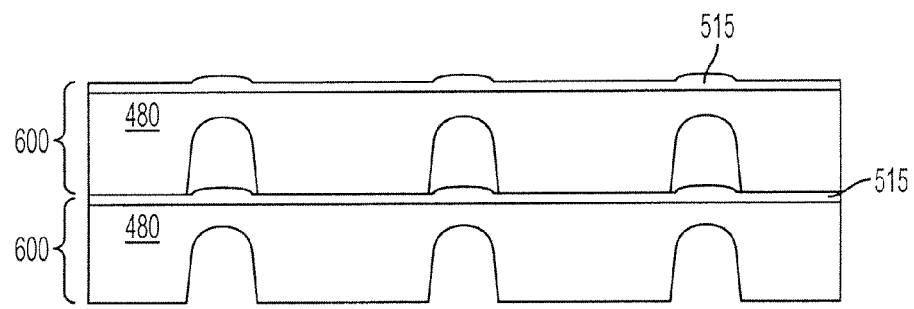
FIG. 14A illustrates a cross-sectional view of a combination spacer lens wafer having a concave lens according to a first example embodiment described herein with lens replication and a second combination spacer lens wafer with lens replication.

Referring now to FIG. 14A, finished concave combination spacer lens wafers with top-surface mounted polymer lenses 600 can be stacked to provide four lenses. While two finished concave combination spacer lens wafers with convex top-surface mounted polymer lenses 600 are shown, one of the combination spacer lens wafers could be convex, and the top-surface mounted polymer lenses 515 could be concave. Additionally, any combination of either unfinished 478, 483 (FIGS. 10A, 10B) or finished combination spacer lens wafers 480, 485 (FIGS. 11A, 11B) can be formed. As such, the number and type of lenses (both top-surface mounted and combination spacer lens wafers) can be tailored to the specific imager's application, while retaining the benefits of simpler assembly, reduced alignment issues, and the prevention of inadvertent tapering of through-holes.

Figure 12C:
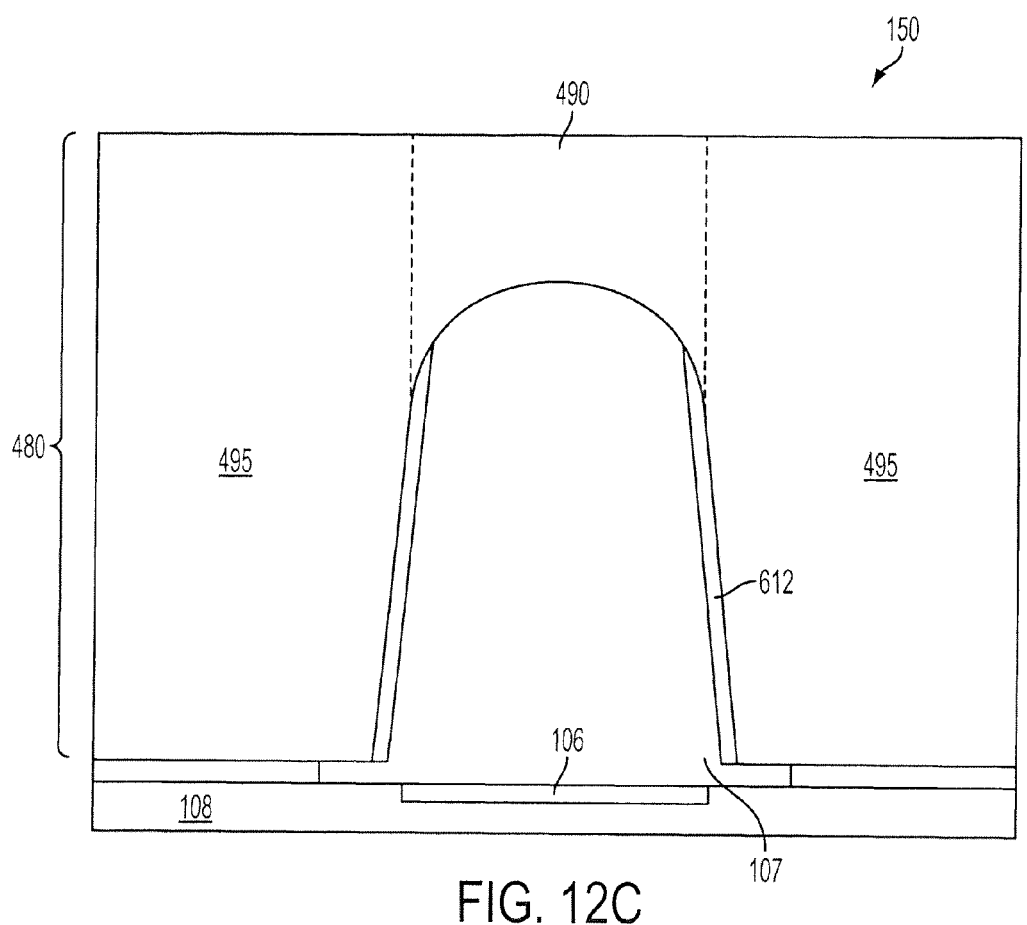
FIG. 12C illustrates a cross-sectional view of an assembled imager module having a single concave combination spacer lens wafer, with a black coating, according to a first example embodiment described herein.
Figure 12D:
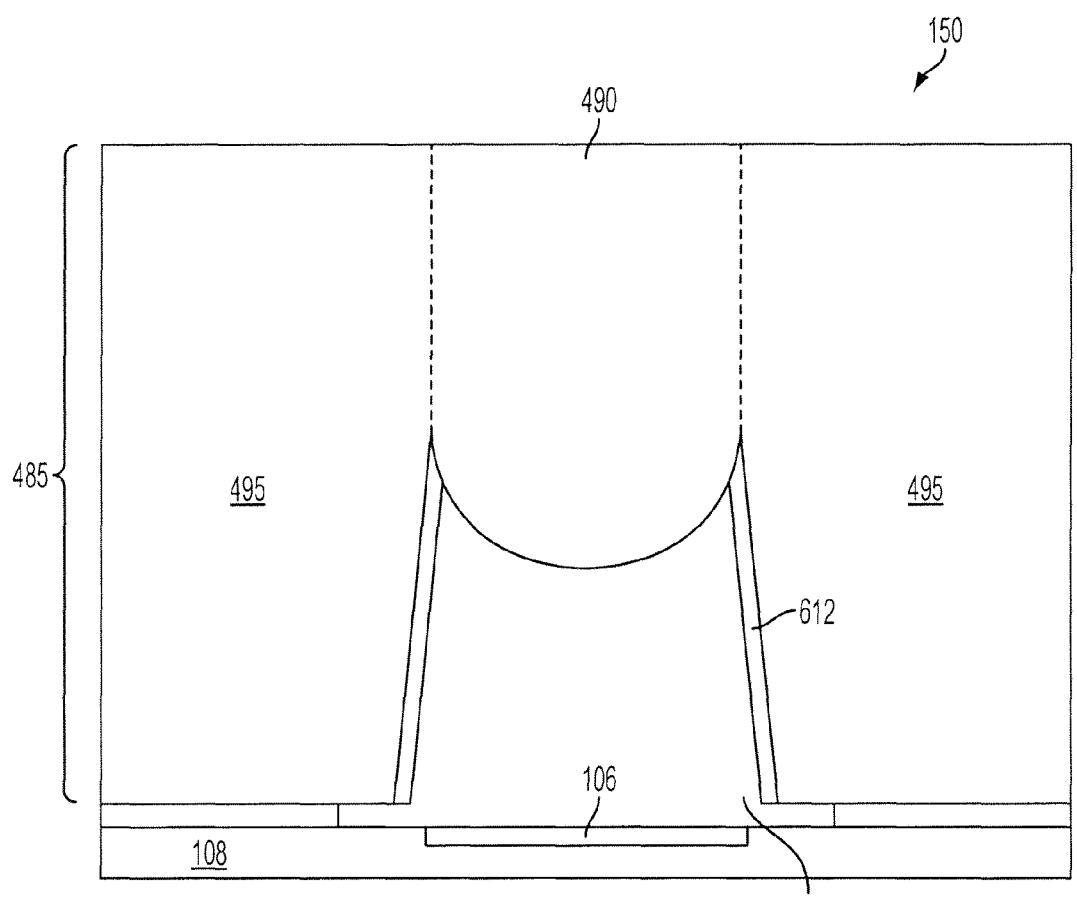
FIG. 12D illustrates a cross-sectional view of an assembled imager module having a single convex combination spacer lens wafer, with a black coating, according to a second example embodiment described herein.
Figure 12E:
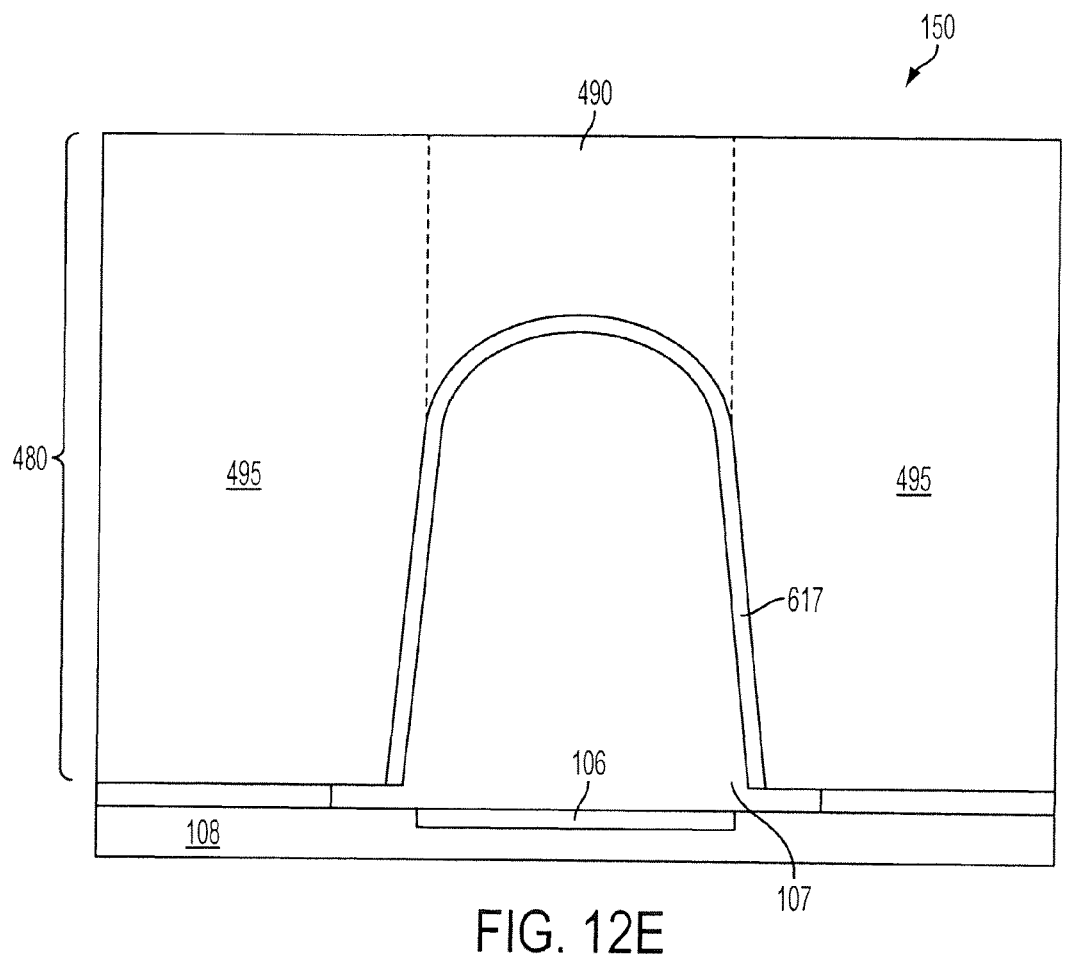
FIG. 12E illustrates a cross-sectional view of an assembled imager module having a single concave combination spacer lens wafer, with an anti-reflective coating, according to a first example embodiment described herein.

Referring now to FIGS. 12C and 12E, once the finished concave combination spacer lens wafer 480 (FIG. 11A), or the finished concave combination spacer lens wafer with top-surface mounted polymer lens 600 (FIG. 13A) is completed, additional processing steps can be performed to improve the performance of the combination spacer lens. For example, a black coating 612 may be applied on the inside side-walls enclosing the combination spacer lens cavity 107 to reduce spurious reflections. Such a coating would improve the signal-to-noise ratio of the imager module 150. Alternatively, an anti-reflective coating 617 may be applied on the inside side-walls and lens enclosing the combination spacer lens cavity 107 to reduce spurious reflections and increase the transmission of the lens interface. Another alternative is to form an opaque material (i.e., black polymer or metal) on top-most portion 497 (FIG. 10A) after it has undergone any necessary finishing step, and prior to application of top-surface mounted polymer lenses 515 (FIG. 13A). The opaque material on top-most portion 497 (FIG. 10A) is formed to have an aperture that allows light to pass through the lens portion of the combination spacer lens wafer 480 (FIG. 11A).

The concave form mold 205 (FIG. 5B), the method of making a finished convex combination spacer lens wafer 485 (FIG. 12B), and the finished convex combination spacer lens wafer 485 (FIG. 12B) are described next.

Figure 5B:
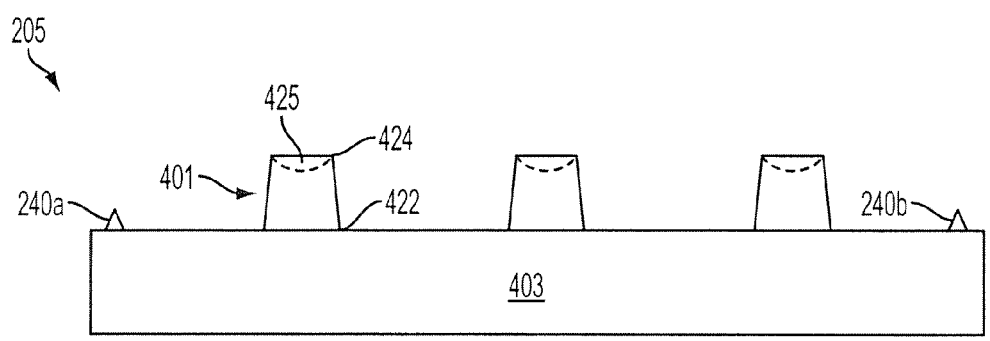
FIG. 5B illustrates a cross-sectional view of a concave form mold for producing a combination spacer lens wafer having a convex lens according to a second example embodiment described herein.

Referring now to FIG. 5B, the concave form mold 205—the apparatus for making convex combination spacer lens wafers 485 (FIG. 12B)—is now described. Concave form mold 205 has spacer section 401, base 403, and concave mold feature 425. In this embodiment, the concave mold feature does not extend away from the spacer section 401 (as it does in FIG. 5A). Instead, mold feature 425 extends into spacer section 401. This is illustrated by the dotted line shown below small square base 424. The concave mold feature 425, however, is not intended to be limiting. A cavity (mold feature 425) of any shape can be made to create a corresponding combination lens portion 490 (FIG. 12B). Highly aspherical lens structures are also possible.

Figure 6B:
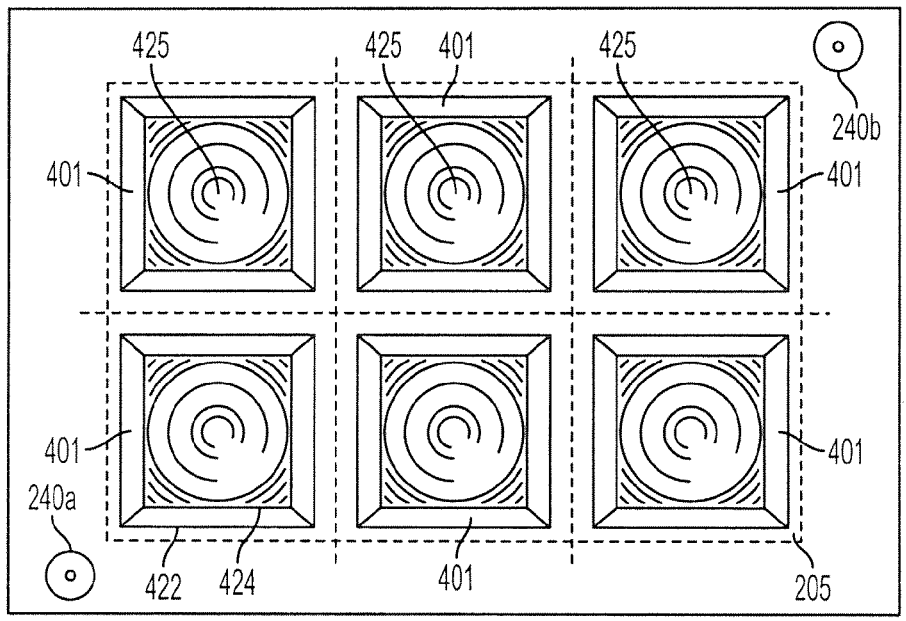
FIG. 6B illustrates an overhead view of a concave form mold for producing a combination spacer lens wafer having a convex lens according to a second example embodiment described herein.

Just as the example embodiment for convex mold feature 425 is not intended to be limiting, the example embodiment for spacer section 401 is also not intended to be limiting. Referring now to FIG. 6B (overhead view of FIG. 5B), spacer section 401 is shown having a large square base 422, and a small square base 424 at its top. Unlike the convex form mold 200 (FIG. 5A), however, the convex mold feature 425 extends in to spacer section 401 instead of extending away from spacer section 401. Despite these differences, spacer section 401 can still have any shape base 422. Similarly, mold feature 425 can still have any shape base 424. As such, spacer section 401 can have any shape, to include a non-tapered shape, or a non-uniform shape. The spacer section 401 and mold feature 425 are preferably integrally formed.

Figure 8B:
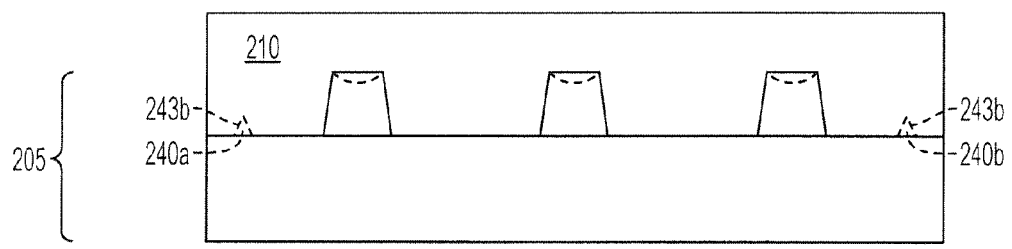

Referring now to FIGS. 5B and 6B, the concave form mold 205 may also have optional alignment elements 240a, 240b that can be used to create corresponding alignment detents 243a, 243b (FIG. 8B). These alignment detents 243a, 243b (FIG. 8B) may be used to align convex combination spacer lens wafer 485 (FIG. 12B) with imager die 108 (FIG. 12B), or alternatively with another convex combination spacer lens wafer 485 (FIG. 12B), a conventional spacer 109 (FIG. 1), or any other imager module 150 part having appropriate alignment detents 243a, 243b (FIG. 8B) complementary to alignment elements 240a, 240b. Two symmetric alignment elements 240a, 240b are shown, but a single non-symmetric alignment element may also be used in conjunction with a matching alignment detent in embodiments where fewer alignment elements are desired.

The method for forming an unfinished convex combination spacer lens wafer 483 (FIG. 10B) is now described with reference to FIGS. 7B, 8B, 9B, and 10B. To form an unfinished convex combination spacer lens wafer 483, a concave form mold 205 (FIG. 5B) is used.

Figure 7B:
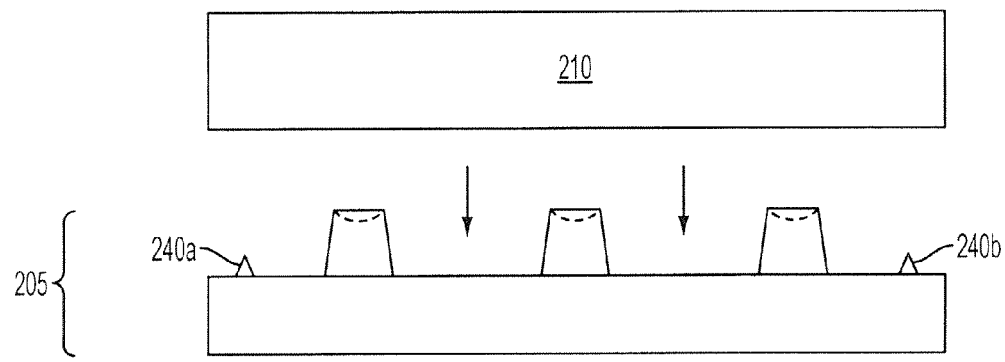
FIGS. 7B, 8B, and 9B illustrate steps of a method of making a combination spacer lens wafer having a convex lens according to a second example embodiment described herein.

Referring to FIG. 7B, a concave form mold 205 is placed underneath wafer blank 210. In one embodiment, wafer blank 210 comprises a float glass. Although glass is described, an optical polymer may also be used. One example of a float glass that may be used is a boro-float glass with a coefficient of thermal expansion between 2 and 5, such as Borofloat® 33 from Schott North America, Inc.

To make wafer blank 210 sufficiently malleable to assume the form of concave form mold 205—whether glass or polymer—wafer blank 210 may be heated by any suitable method. Once an appropriate temperature is reached if heating is being applied, wafer blank 210 is lowered into contact with and pressed on to concave form mold 205. Wafer blank 210 may be heated to an appropriate temperature while on concave form mold 205 to allow concave form mold 205 to penetrate wafer blank 210. Wafer blank 210 may receive concave mold feature 425 (FIG. 5B) and spacer section 401 (FIG. 5B) of concave form mold 205. Wafer blank 210 may also receive the alignment elements 240a, 240b, if present.

Referring now to FIG. 8B, once wafer blank 210 has been displaced such that spacer section 401 (FIG. 5B), concave mold feature 425 (FIG. 5B), and alignment elements 240a, 240b (FIG. 5B) (if present) have been transferred, wafer blank 210 is allowed to cool so that it will hold its shape upon removal from concave form mold 205. Depending on the glass or polymer used for wafer blank 210, an appropriate curing time should be allowed to pass. Also based on the material used for wafer blank 210, the curing can be either an accelerated cooling, a gradual cooling, or alternating heating and cooling to ensure certain properties are developed within the glass or polymer used for the wafer blank 210.

Figure 9B:
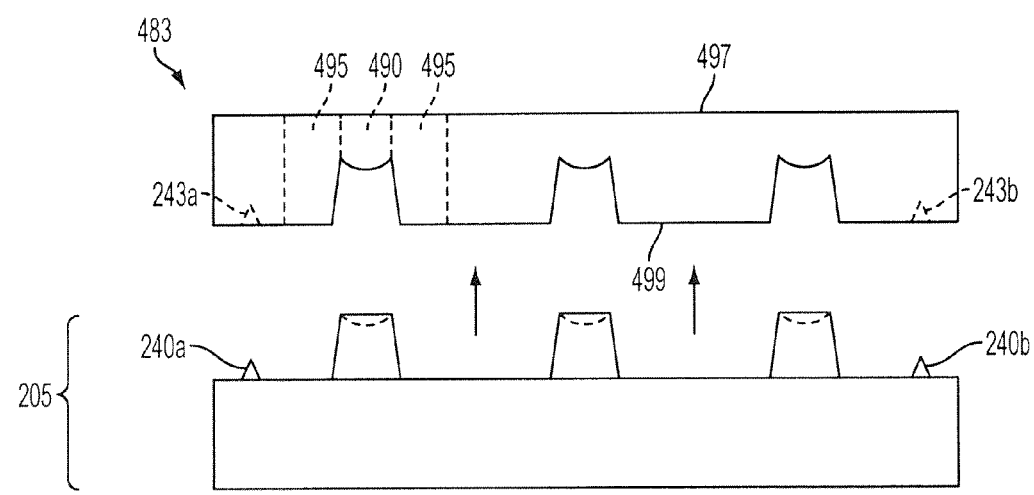
Figure 10B:
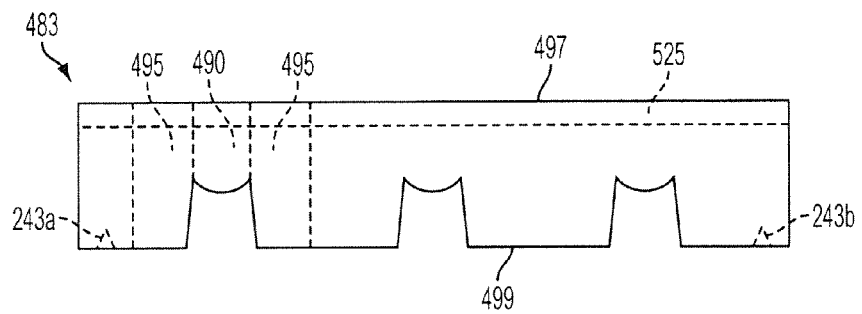
FIG. 10B illustrates an unfinished combination spacer lens wafer having a convex lens according to a second example embodiment described herein.

Referring now to FIG. 9B, once the appropriate curing or cooling has occurred, wafer blank 210 (FIG. 7B) has assumed the shape of concave form mold 205. Once this has occurred, unfinished convex combination spacer lens wafer 483 can be removed from mold 205. Referring now to FIG. 10B, unfinished convex combination spacer lens wafer 483 has a combination lens portion 490 and a combination spacer portion 495. The unfinished convex combination spacer lens wafer 483 may also have alignment detents 243a, 243b in cases where the form mold 205 had corresponding alignment elements 240a, 240b.

To ensure stability during placement and removal during the fabrication stages, wafer blank 210 (FIG. 7B) in most embodiments will have a thickness greater than that desired for use with the imager module 150 (FIG. 12A). This additional thickness may require the topmost portion 497 of the unfinished convex combination spacer lens wafer 483 to undergo additional finishing through the removal of area 525. Additional finishing, however, may not be required for embodiments in which wafer blank 210 (FIG. 7B) does not require additional material for added stability during placement and removal of wafer blank 210 (FIG. 7B) during the fabrication stages.

Even in situations where additional material is unnecessary for stability purposes, grinding and polishing may still be necessary to achieve a flat surface. In these cases, displacement of wafer blank 210 (FIG. 7B) results in deformations at topmost portion 497 of unfinished concave combination spacer lens wafer 483. Grinding and polishing is performed to remove these deformations.

Figure 11B:
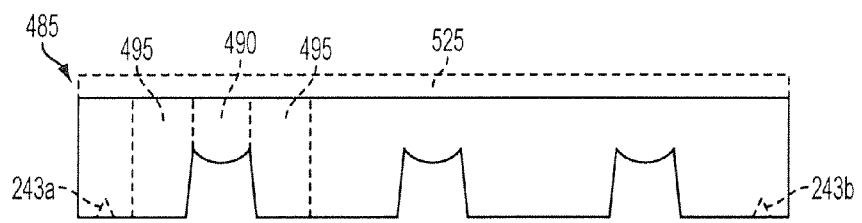
FIG. 11B illustrates a finished combination spacer lens wafer having a convex lens according to a second example embodiment described herein.

Referring now to FIG. 11B, in embodiments where additional finishing is required, the unfinished convex combination spacer lens wafer 483 will undergo a finishing step, which may include grinding, or chemical etching to narrow the distance between the top-most portion 497 (FIG. 10B) of unfinished convex combination spacer lens wafer 483 (FIG. 10B) and the bottom-most portion 499 (FIG. 10B) of unfinished convex combination spacer lens wafer 483 (FIG. 10B). The top-most portion 497 (FIG. 10B) undergoes the finishing step by removal of area 525. Once this thinning has occurred, the result is a finished convex combination spacer lens wafer 485.

The finished convex combination spacer lens wafer 485 is now described with reference to FIG. 12B. Finished convex combination spacer lens wafer 485 has a combination lens portion 490 and a combination spacer portion 495. The combination lens portion 490 acts as the lens, while the combination spacer portion 495 acts as a spacer for separating the combination lens portion 490 a specific distance from the imager pixel array 106. Finished convex combination spacer lens wafers 485 may also have alignment detents 243a, 243b (FIG. 11B) in cases where the form mold 205 (FIG. 5B) had corresponding alignment elements 240a, 240b (FIG. 5B).

Placing the finished convex combination spacer lens wafer 485 onto a wafer containing an imager pixel array 106 fully encloses combination spacer lens cavity 107. Whatever shape spacer section 401 (FIG. 5B) has during formation is the shape that spacer lens cavity 107 will have after assembly.

In one embodiment finished convex combination spacer lens wafers 485 can be divided into single finished convex combination spacer lens wafers 485. This enables a single finished convex combination spacer lens 485 to be individually placed on an imager pixel array 106. Alternatively, multiple finished convex combination spacer lenses 485 can remain joined and be simultaneously placed over and aligned with an imager pixel array 106. In this case, alignment can be done using alignment elements 240a, 240b (FIG. 9B) (if present) in conjunction with alignment detents 243a, 243b (FIG. 9B). Additionally, moving finished convex combination spacer lens wafers 485 can be performed using a vacuum tool, as there are no through-holes in this combination spacer lens wafer 485 that were present in the prior art.

Figure 13B:
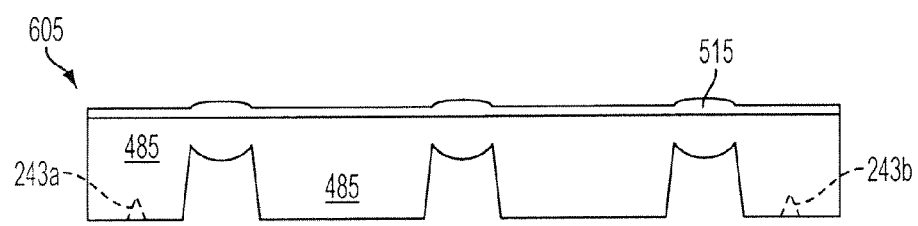
FIG. 13B illustrates a cross-sectional view of a combination spacer lens wafer having a convex lens according to second example embodiment described herein with lens replication completed.

In cases where additional lenses (in a vertical stack) are required, the finished convex combination spacer lens wafer 485 can undergo additional processing steps. Referring now to FIG. 13B, a polymer lens replication step can be performed on the surface of finished convex combination spacer lens wafer 485 in order to form a finished convex combination spacer lens wafer with top-surface mounted polymer lens 605.

In embodiments having additional lenses, achromatization may be achieved by using distinct materials having different optical dispersions (variation of refractive index with wavelength, represented by an Abbe number). Using two separate materials, one with high dispersion (low Abbe number, less than or equal to 50), and one with low dispersion (high Abbe number, greater than 50), may avoid chromatic aberrations. Generally, a glass with high dispersion is used for the finished convex combination spacer lens wafer 485, and an ultraviolet-curable polymer (for example Ormocomp of the ORMOCER® material family from Micro Resist Technology) with a low dispersion may be used for the top-surface mounted polymer lens 515. In some cases, however, two different types of polymer having different optical dispersions may be used for both the finished convex combination spacer lens wafer 485 and the top-surface mounted polymer lens 515.

Figure 14B:
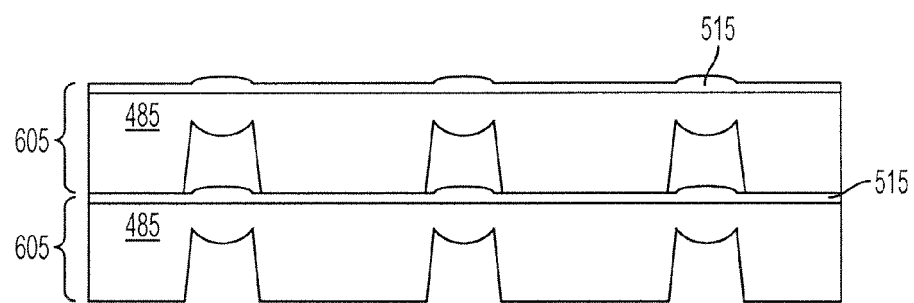
FIG. 14B illustrates a cross-sectional view of a combination spacer lens wafer having a convex lens according to a second example embodiment described herein with lens replication and a second combination spacer lens wafer with lens replication.

Referring now to FIG. 14B, finished convex combination spacer lens wafers with top-surface mounted polymer lenses 605 can be stacked to provide four lenses. While two finished convex combination spacer lens wafers with convex top-surface mounted polymer lenses 605 are shown, one of the combination spacer lens wafers could be concave, and the top-surface mounted polymer lenses 515 could be concave. Additionally, any combination of either unfinished 478, 483 (FIGS. 10A, 10B) or finished combination spacer lens wafers 480, 485 (FIGS. 11A, 11B) can be formed. As such, the number and type of lenses (both top-surface mounted and combination spacer lens wafers) can be tailored to the specific imager's application, while retaining the benefits of simpler assembly, reduced alignment issues, and the prevention of inadvertent tapering of through-holes.

Figure 12F:
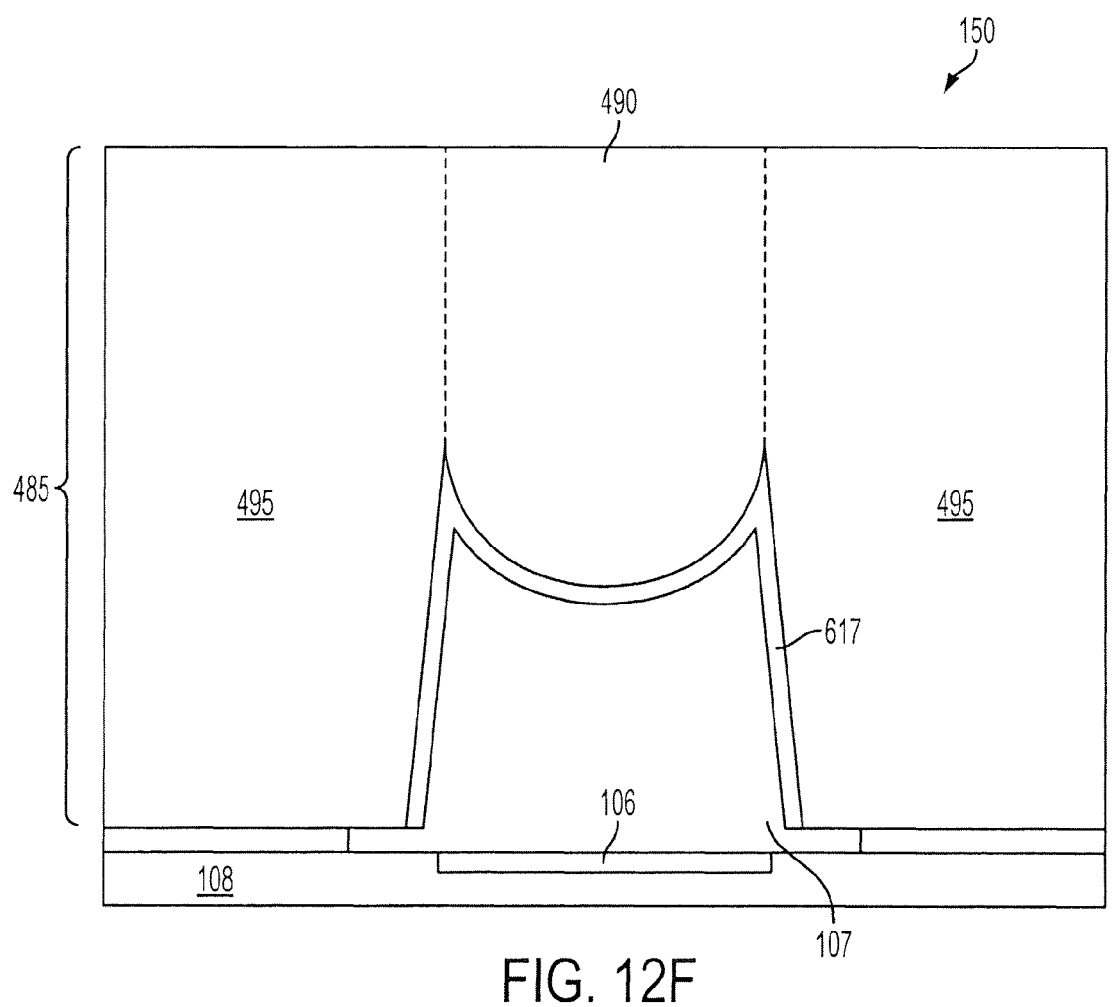
FIG. 12F illustrates a cross-sectional view of an assembled imager module having a single convex combination spacer lens wafer, with an anti-reflective coating, according to a second example embodiment described herein.

Referring now to FIGS. 12D and 12F, once the finished convex combination spacer lens wafer 485 (FIG. 11B), or the finished convex combination spacer lens wafer with top-surface mounted polymer lens 605 (FIG. 13B) is completed, additional processing steps can be performed to improve the performance of the combination spacer lens wafer. For example, a black coating 612 may be applied on the inside side-walls enclosing the combination spacer lens cavity 107 to reduce spurious reflections. Such a coating would improve the signal-to-noise ratio of the imager module 150. Alternatively, an anti-reflective coating 617 may be applied on the inside side-walls and lens enclosing the combination spacer lens cavity 107 to reduce spurious reflections and increase the transmission of the lens interface. Another alternative is to form an opaque material (i.e., black polymer or metal) on top-most portion 497 (FIG. 10B) after it has undergone any necessary finishing step, and prior to application of top-surface mounted polymer lenses 515 (FIG. 13B). The opaque material on top-most portion 497 (FIG. 10B) is formed to have an aperture that allows light to pass through the lens portion of the combination spacer lens wafer 485 (FIG. 11B).

Figure 15:
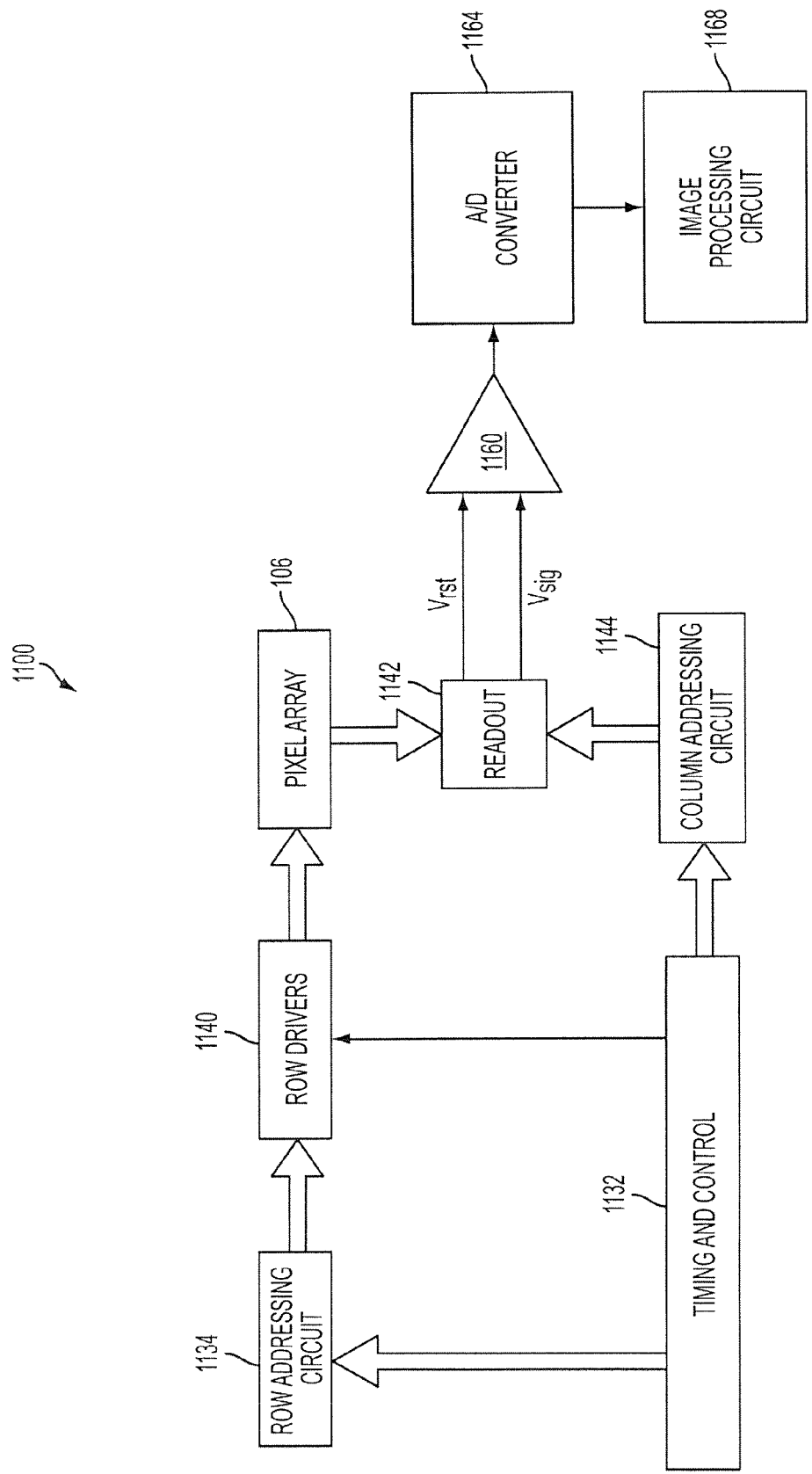
FIG. 15 illustrates a block diagram of a CMOS imaging device constructed using combination spacer lenses made using methods and apparatuses in accordance with an example embodiment described herein.

FIG. 15 shows a block diagram of an imaging device 1100, (e.g. a CMOS imager), that may be used in conjunction with a combination spacer lens wafer 480, 485 (FIGS. 12A, 12B) according to embodiments described herein. A timing and control circuit 1132 provides timing and control signals for enabling the reading out of signals from pixels of the pixel array 106 in a manner commonly known to those skilled in the art. The pixel array 106 may use a combination spacer lens wafer, for example 480, 485 as shown in FIGS. 12A and 12B. The pixel array 106 of FIG. 15 has dimensions of M rows by N columns of pixels, with the size of the pixel array 106 depending on a particular application.

Signals from the imaging device 1100 are typically read out a row at a time using column parallel readout architecture. The timing and control circuit 1132 selects a particular row of pixels in the pixel array 106 by controlling the operation of a row addressing circuit 1134 and row drivers 1140. Signals stored in the selected row of pixels are provided to a readout circuit 1142. The signals are read from each of the columns of the array sequentially or in parallel using a column addressing circuit 1144. The pixel signals, which include a pixel reset signal Vrst and image pixel signal Vsig, are provided as outputs of the readout circuit 1142, and are typically subtracted in a differential amplifier 1160 and the result digitized by an analog to digital converter 1164 to provide a digital pixel signal. The digital pixel signals represent an image captured by an exemplary pixel array 106 and are processed in an image processing circuit 1168 to provide an output image.

Figure 16:
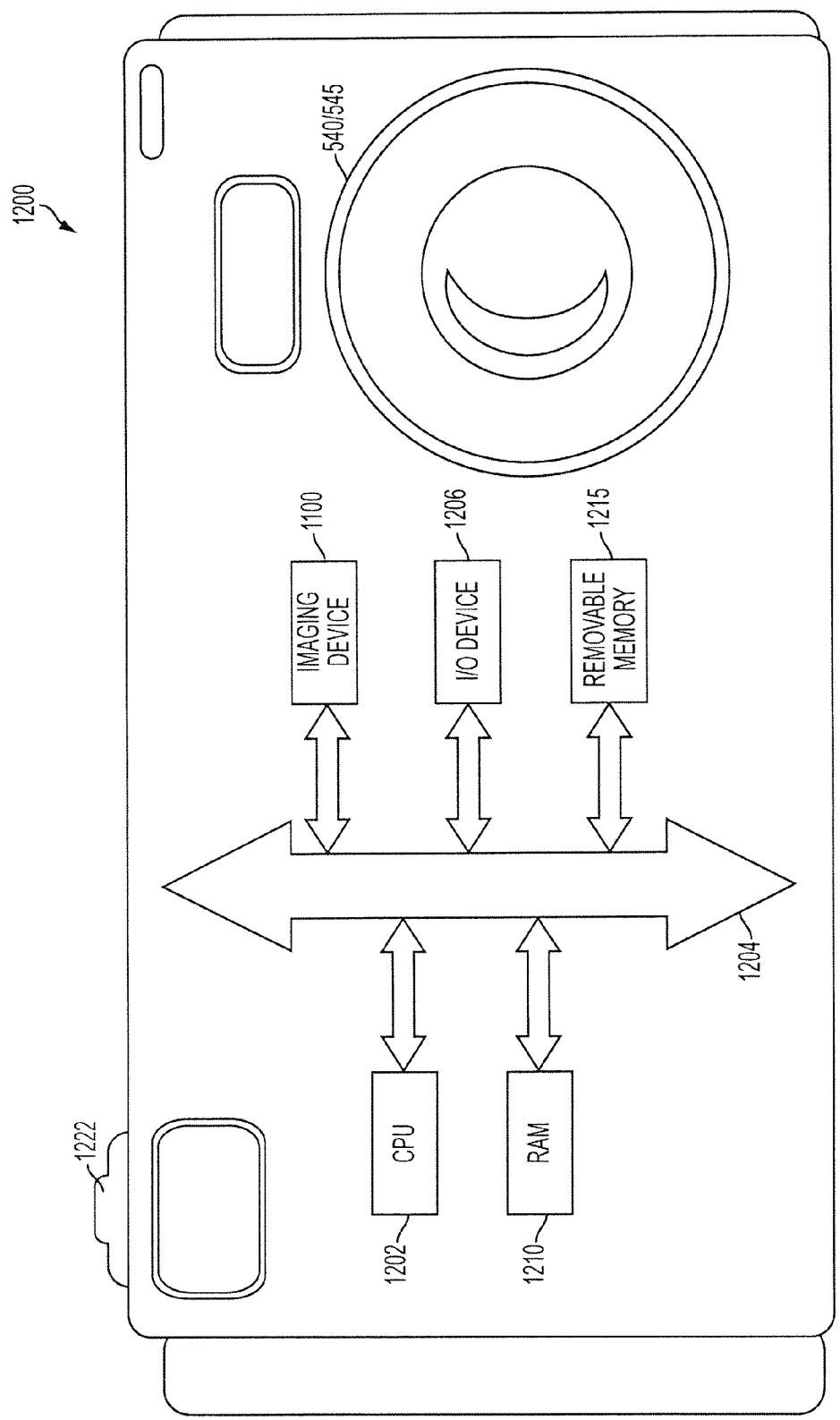
FIG. 16 depicts a system using combination spacer lenses made with methods and apparatuses in accordance with an example embodiment described herein.

FIG. 16 shows a system 1200 that includes an imaging device 1100 and a lens 540 constructed and operated in accordance with the various embodiments described above. The system 1200 is a system having circuits that include imaging device 1100. Without being limiting, such a system could include a computer system, camera system, scanner, machine vision, vehicle navigation, video telephone, surveillance system, auto focus system, star tracker system, motion detection system, image stabilization system, or other image acquisition system.

System 1200, e.g., a digital still or video camera system, generally comprises a central processing unit (CPU) 1202, such as a control circuit or microprocessor for conducting camera functions that communicates with one or more input/output (I/O) devices 1206 over a bus 1204. Imaging device 1100 also communicates with the CPU 1202 over the bus 1204. The processor system 1200 also includes random access memory (RAM) 1210, and can include removable memory 1215, such as flash memory, which also communicates with the CPU 1202 over the bus 1204. The imaging device 1100 may be combined with the CPU processor with or without memory storage on a single integrated circuit or on a different chip than the CPU processor. In a camera system, a lens 540 according to various embodiments described herein may be used to focus image light onto the pixel array 106 of the imaging device 1100 and an image is captured when a shutter release button 1222 is pressed. The pixel array 106 may have at least one pixel that uses a combination spacer lens wafer 480, 485 as shown in FIGS. 12A and 12B.

While embodiments have been described in detail in connection with the embodiments known at the time, it should be readily understood that the claimed invention is not limited to the disclosed embodiments. Rather, the embodiments can be modified to incorporate any number of variations, alterations, substitutions or equivalent arrangements not heretofore described. For example, while some embodiments are described in connection with a CMOS pixel imaging device, they can be practiced with any other type of imaging device (e.g., CCD, etc.) employing a pixel array or a camera using film instead of a pixel array.

Although certain advantages have been described above, those skilled in the art will recognize that there may be many others. For example, the steps in the methods described herein may be performed in different orders, or may include some variations, such as alternative materials having similar functions. Furthermore, while the specific stacks of combination spacer lens wafers are described above in various embodiments, alternate embodiments including more or fewer lenses are possible. Accordingly, the claimed invention is not limited by the embodiments described herein but is only limited by the scope of the appended claims.

What is claimed as new and desired to be protected by Letters Patent of the United States is:

1. An imager module comprising:
   an imager die;
   an imager pixel array mounted on the imager die; and
   a first spacer lens comprising a lens portion and a spacer portion formed as a single unitary piece with a substantially flat upper surface,
      wherein the lens portion and the spacer portion create a fully enclosed first spacer lens cavity between the imager die and the lens portion; and
      wherein the spacer portion of the spacer lens is bonded to the imager die and an interior surface of said lens portion adjacent to the first spacer lens cavity has a curved surface such that the lens portion is optically aligned with the imager pixel array.

2. The imager module of claim 1, wherein inner sidewalls of the first spacer lens enclosing the first spacer lens cavity are covered with a black coating.

3. The imager module of claim 1, wherein inner sidewalls of the first spacer lens and the lens portion enclosing the first spacer lens cavity are covered with an anti-reflective coating.

4. The imager module of claim 1, wherein the top-most portion of the first spacer lens is covered by an opaque material having an aperture corresponding to the lens portion.

5. The imager module of claim 1, wherein the lens portion of the first spacer lens is a convex lens.

6. The imager module of claim 1, wherein the lens portion of the first spacer lens is a concave lens.

7. The imager module of claim 1, further comprising a polymer lens mounted on a top-surface of the first spacer lens in optical alignment with the lens portion of the first spacer lens.

8. The imager module of claim 1, further comprising a second spacer lens affixed to a top-surface of the first spacer lens.

9. The imager module of claim 8, wherein at least one of the first and second spacer lenses has a top-surface mounted polymer lens in optical alignment with the lens portion of the first and second spacer lenses.

10. The imager module of claim 7, wherein the first spacer lens is formed from glass having a high dispersion and the top-surface mounted polymer lens is formed from a polymer having a low dispersion such that chromatic aberrations are minimized.

11. An imager module comprising:
an imager pixel array; and
a first spacer lens formed by molding a single unitary piece of material, the first spacer lens comprising:
    a lens portion having a substantially flat upper surface and a curved interior surface such that the lens portion is optically aligned with the imager pixel array;
    a spacer portion suspending the lens portion a distance above the imager pixel array, wherein the spacer portion is bonded to an imager die upon which the imager pixel array is mounted to fully enclose a space between the imager pixel array and the lens portion; and
    at least one spacer alignment element that optically aligns the lens portion with the imager pixel array.

12. The imager module of claim 11, wherein the lens portion of the first spacer lens is a convex lens.

13. The imager module of claim 11, wherein the lens portion of the first spacer lens is a concave lens.

14. The imager module of claim 11, wherein the lens portion of the first spacer lens is formed from a material having a high optical dispersion.

15. The imager module of claim 11, wherein the lens portion of the first spacer lens is made of boro-float glass.

16. The imager module of claim 15, wherein the boro-float glass has a coefficient of thermal expansion between 2 and 5.

17. The imager module of claim 11, wherein the lens portion of the first spacer lens is formed from a polymer.

18. The imager module of claim 11, further comprising a polymer lens mounted on a top-surface of the first spacer lens in optical alignment with the lens portion of the first spacer lens.

19. The imager module of claim 18, wherein the polymer lens and the first spacer lens have different optical dispersions.

20. The imager module of claim 18, wherein the polymer lens is an ultraviolet-curable polymer.

21. The imager module of claim 17, further comprising a polymer lens mounted on a top-surface of the first spacer lens in optical alignment with the lens portion of the first spacer lens.

22. The imager module of claim 21, wherein the polymer lens and the lens portion of the first spacer lens are made of different polymers.

23. An imager module comprising:
an imager die;
an imager pixel array mounted on the imager die;
a first spacer lens comprising a lens portion and a spacer portion formed as a single unitary piece with a substantially flat upper surface; and
a second spacer lens affixed to a top-surface of the first spacer lens,
wherein the lens portion and the spacer portion of the first spacer lens create a fully enclosed first spacer lens cavity between the imager die and the lens portion, and an interior surface of the lens portion adjacent to the first spacer lens cavity has a curved surface to optically align the lens portion with the imager pixel array.

24. The imager module of claim 23, wherein inner sidewalls of the first spacer lens enclosing the first spacer lens cavity are covered with a black coating.

25. The imager module of claim 23, wherein inner sidewalls of the first spacer lens and the lens portion enclosing the first spacer lens cavity are covered with an anti-reflective coating.

26. The imager module of claim 23, wherein the top-most portion of the first spacer lens is covered by an opaque material having an aperture corresponding to the lens portion.

27. The imager module of claim 23, wherein the lens portion of the first spacer lens is a convex lens.

28. The imager module of claim 23, wherein the lens portion of the first spacer lens is a concave lens.

29. The imager module of claim 23, wherein at least one of the first and second spacer lenses has a top-surface mounted polymer lens in optical alignment with the lens portion of the first and second spacer lenses.

30. The imager module of claim 29, wherein the first spacer lens is formed from glass having a high dispersion and the top-surface mounted polymer lens is formed from a polymer having a low dispersion such that chromatic aberrations are minimized.

31. The imager module of claim 23, wherein the spacer portion of the first spacer lens is bonded to the imager die.

* * * * *